United States Patent
Liu et al.

(10) Patent No.: US 10,510,971 B2
(45) Date of Patent: Dec. 17, 2019

(54) VAPOR-DEPOSITED NANOSCALE IONIC LIQUID GELS AS GATE INSULATORS FOR LOW-VOLTAGE HIGH-SPEED THIN FILM TRANSISTORS

(71) Applicant: Massachusetts Institute of Technology, Cambridge, MA (US)

(72) Inventors: Andong Liu, Brookline, MA (US); Karen K. Gleason, Cambridge, MA (US); Minghui Wang, Quincy, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/038,750

(22) Filed: Jul. 18, 2018

(65) Prior Publication Data
US 2019/0131554 A1    May 2, 2019

Related U.S. Application Data

(60) Provisional application No. 62/533,899, filed on Jul. 18, 2017.

(51) Int. Cl.
| | |
|---|---|
| *H01L 51/05* | (2006.01) |
| *H01G 11/04* | (2013.01) |
| *H01L 51/00* | (2006.01) |
| *B05D 1/00* | (2006.01) |
| *C08J 5/18* | (2006.01) |

(Continued)

(52) U.S. Cl.
CPC .............. *H01L 51/052* (2013.01); *B05D 1/60* (2013.01); *C08J 5/18* (2013.01); *H01B 1/122* (2013.01); *H01G 11/04* (2013.01); *H01L 21/02118* (2013.01); *H01L 21/02271* (2013.01); *H01L 28/40* (2013.01); *H01L 51/001* (2013.01); *H01L 51/004* (2013.01); *C08J 2333/26* (2013.01)

(58) Field of Classification Search
CPC ................. H01L 51/052; H01L 51/004; H01L 21/02271; H01L 21/02118; H01L 51/001; H01L 28/40; B05D 1/60; H01B 1/122; C08J 5/18; C08J 2333/26; H01G 11/04
See application file for complete search history.

(56) References Cited

U.S. PATENT DOCUMENTS

| | | | |
|---|---|---|---|
| 2009/0218537 A1* | 9/2009 | Soroushian | H01B 1/122 252/62.2 |
| 2010/0308754 A1* | 12/2010 | Gough | C07D 209/82 315/363 |

(Continued)

OTHER PUBLICATIONS

Kubisa ("Ionic Liquids in the Synthesis and Modification of Polymers," J. Polym. Sci. Part A: Polym. Chem. vol. 43, pp. 4675-4683, 2005) (Year: 2005).*

(Continued)

*Primary Examiner* — Yasser A Abdelaziez
(74) *Attorney, Agent, or Firm* — Dana M. Gordon; Foley Hoag LLP

(57) ABSTRACT

Described are materials and methods for fabricating low-voltage MHz ion-gel-gated thin film transistor devices using patternable defect-free ionic liquid gels. Ionic liquid gels made by the initiated chemical vapor deposition methods described herein exhibit a capacitance of about 1 μF cm$^{-2}$ at about 1 MHz, and can be as thin as about 20 nm to about 400 nm.

20 Claims, 3 Drawing Sheets

(51) Int. Cl.
*H01B 1/12* (2006.01)
*H01L 21/02* (2006.01)
*H01L 49/02* (2006.01)

(56) References Cited

U.S. PATENT DOCUMENTS

| | | | | |
|---|---|---|---|---|
| 2012/0217491 A1* | 8/2012 | Osako | ............... | C08F 12/14 257/40 |
| 2013/0292167 A1* | 11/2013 | Schmid | ............ | B82Y 30/00 174/260 |
| 2017/0098846 A1* | 4/2017 | Watakabe | ............ | C08F 234/02 |

OTHER PUBLICATIONS

Ma et al. ("Reverse Atom Transfer Radical Polymerization of Methyl Methacrylate in Room-Temperature Ionic Liquids," Journal of Polymer Science: Part A: Polymer Chemistry, vol. 41, 143-151 2003) (Year: 2003).*

STIC Search History and Results, 2019 (Year: 2019).*

* cited by examiner

VAPOR-DEPOSITED NANOSCALE IONIC LIQUID GELS AS GATE INSULATORS FOR LOW-VOLTAGE HIGH-SPEED THIN FILM TRANSISTORS

CROSS-REFERENCE TO RELATED APPLICATIONS

This application claims the benefit of priority to U.S. Provisional Patent Application Ser. No. 62/533,899, filed Jul. 18, 2017.

STATEMENT REGARDING FEDERALLY SPONSORED RESEARCH

This invention was made with Government support under Grant No. N00014-13-1-0466 awarded by the Office of Naval Research. The Government has certain rights in the invention.

BACKGROUND

Thin film transistors (TFTs), particularly organic TFTs (OTFTs), have drawn increasing attention due to their key role in enabling the next-generation flexible electronics. Low-voltage operation is a highly desirable characteristic of TFTs as it leads to low power consumption. High-capacitance gate insulators are crucial for the achievement of lower operating voltages. This can be seen from the equation governing transistor drain current in the linear regime:

$$I_D = \mu C_i (W/L)(V_G - V_T) V_D \quad (0.1)$$

where $\mu$ is the carrier mobility, $C_i$ is the specific areal capacitance of the gate insulator, W/L is the width to length ratio, and $V_G$, $V_T$ and $V_D$ are the gate, threshold, and drain voltages. With identical device geometry and semiconducting material, an increase in $C_i$ would allow a TFT to output equivalent current with a reduced operation voltage. Inorganic and organic high-k and/or ultrathin dielectrics have achieved a $C_i$ on the order of 0.1 $\mu$F cm$^{-2}$. Alternatively, electrically insulating but ionically conducting solid-state electrolytes (SSEs) have been utilized as gate dielectrics in TFTs, yielding electrolyte-gated TFTs (EGTs). The primary benefits of employing this class of materials is their exceptionally high $C_i$ (1-10 $\mu$F cm$^{-2}$), enabling the operation at <2 V. When a voltage is applied, the ions in the SSE insulators form electrical double layer (EDL) at the interfaces, which can be considered nanometer-thick capacitors, giving rise to the ultrahigh capacitance. Additionally, SSE insulators can be deposited at room temperature, usually by solution-based techniques, allowing them to work with unconventional substrates such as plastic. To compare, the preparation process of some conventional high-k metal oxide dielectrics can be destructive to the substrates required by soft electronics. Among the SSEs applied in TFTs, ionic liquid (IL) gels, here referred to as ion-gels, are particularly promising because of their stability, non-volatility, and high ionic conductivity.

Besides low voltage, high switching speed is another greatly desirable characteristic of modern TFTs. For some demanding applications, such as high-frequency radio-frequency identification (HF RFID) and high-resolution video displays with integrated row and column drivers, megahertz (MHz) operation is required. Moreover, as the direction for the field of organic electronics move beyond demonstration of individual devices to integrated circuits, maximal operating frequency with minimal supply bias is a much sought-after merit for a range of envisioned functions. A high-speed integrated circuit, which consists of multiple stages and exhibit accumulative time delays from each stage, would require the fast-response of every unit. Unfortunately, ion-gel-gated TFTs (denoted hereafter as IGTs) are known to show relatively low switching speed, originated from its slow polarization speed. Normally, transistor switching times depend on the channel length and the charge-carrier mobility. For IGTs, however, the electrolyte polarization speed is often bottlenecking the device's switching speed, hindering the device from fully exploiting the high charge-carrier mobility of the semiconductors. The polarization of ion-gels involves the transport of ions, and therefore is substantially slower than the dielectric polarization mechanism for traditional gate insulators. The time constant of the EDL formation $\tau_{EDL}$ can be expressed in the following equation:

$$\tau_{EDL} = \frac{d \varepsilon \varepsilon_0}{2 \lambda_D \sigma} \quad (0.2)$$

where d is the gate insulator thickness, $\varepsilon$ is the relative permittivity of the electrolyte, $\varepsilon_0$ is the vacuum permittivity, $\lambda_D$ is the Debye length, $\sigma$ is the ionic conductivity. Research has been dedicated to reduce $\tau_{EDL}$ primarily by maximizing the ionic conductivity. Significant progress has been made, allowing the state-of-the-art ion-gels to maintain a high $C_i$ of 1 $\mu$F cm$^{-2}$ up to 10-100 kHz. Although it is recognized that thinning down d is another key route to further improved $C_i$, a functional ion-gel under 1 $\mu$m thick has not been demonstrated yet, probably because of the difficulties to ensure film uniformity and absence of pinholes at this thinness. As a result, beyond 10-100 kHz, the $C_i$ of previously reported ion-gels deteriorates rapidly to several orders of magnitude below 1 $\mu$F cm$^{-2}$. Despite that IGT is theoretically promising to operate with low-voltage in MHz regime, an electrolyte insulator with $C_i$ of 1 $\mu$F cm$^{-2}$ at 1 MHz has never been practically demonstrated, not to mention a MHz IGT device. In our opinion, the lack of nanoscale pinhole-free ion-gels, whose fabrication is compatible with the multi-step transistor production, is hindering the development of IGTs, which urges an immediate solution.

There exists a need for low-voltage MHz IGT devices, and methods of fabricating them.

SUMMARY

In certain embodiments, the invention relates to a film comprising a crosslinked polymer and an ionic liquid, wherein the ionic liquid is dispersed in the crosslinked polymer; the crosslinked polymer comprises a plurality of residues of a monomer and a plurality of residues of a crosslinker; the film has a thickness of about 20 nm to about 1000 nm; and the film has a capacitance of about 1 $\mu$F/cm$^2$ to about 5 $\mu$F/cm$^2$ at a frequency of about 1 MHz.

In certain embodiments, the invention relates to a method of making a film, comprising the steps of:

by iCVD, synthesizing and depositing on a substrate a crosslinked polymer, wherein the crosslinked polymer comprises a plurality of residues of a monomer and a plurality of residues of a crosslinker;

synthesizing a matrix comprising a bulk polymer and an ionic liquid; and contacting the crosslinked polymer with the matrix for a period of time sufficient to allow the ionic liquid to diffuse into the crosslinked polymer, thereby forming the film, wherein the film has a thickness of about 20 nm to about 1000 nm.

In certain embodiments, the invention relates to a film formed by any of the methods described herein.

In certain embodiments, the invention relates to a device, comprising any of the films described herein, a cathode, and an anode.

DETAILED DESCRIPTION

Overview

Figures 1A, 1B, 1C, 1D:
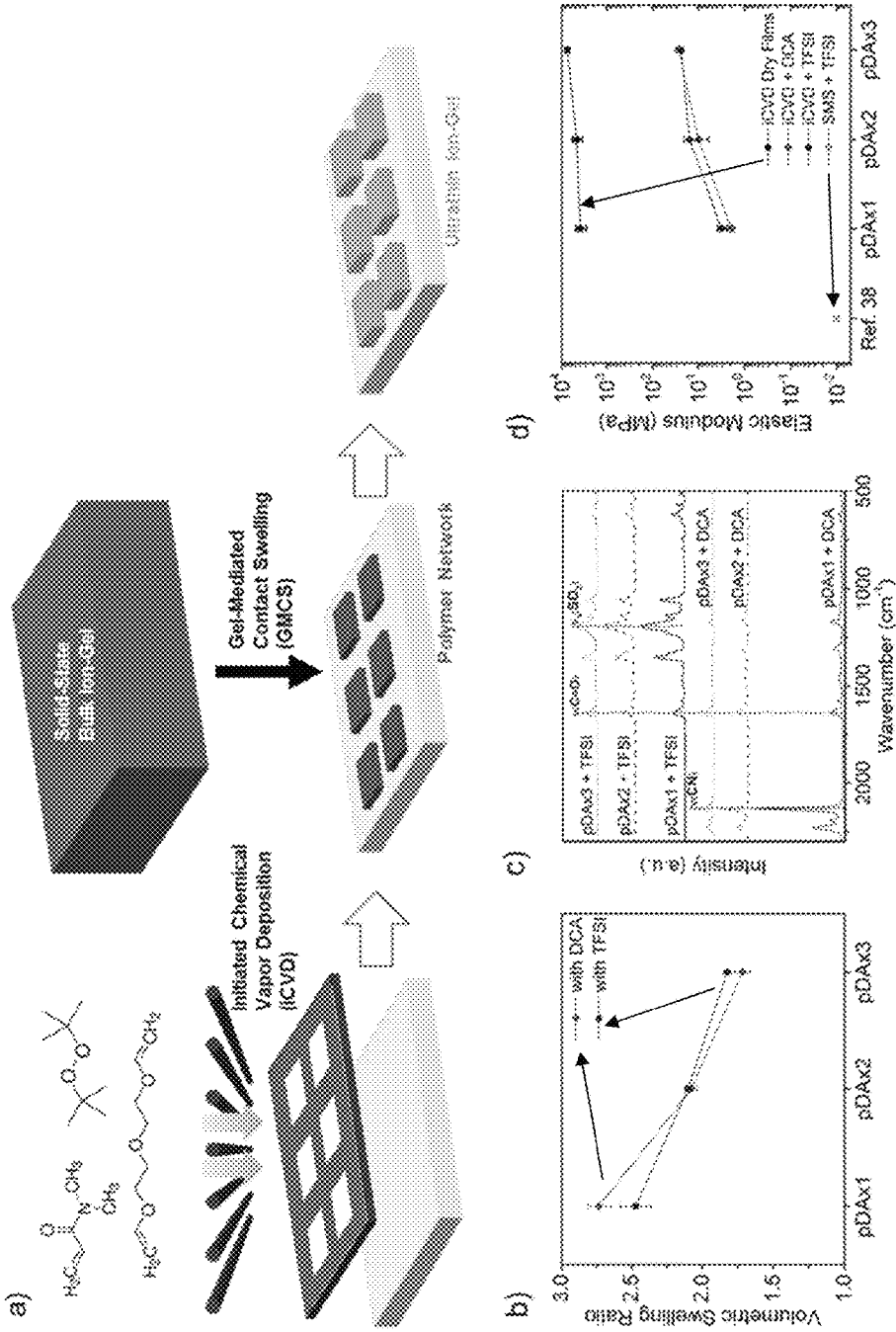
FIG. 1A is a schematic illustration of fabrication process for iCVD ion-gels. A chemically crosslinked polymer matrix pDAx is first synthesized via iCVD on substrate, with the option of patterning by a stencil mask. Then the polymer networks are impregnated with desired IL through a post-modification step, gel-mediated contact swelling (GMCS).
FIG. 1B is a graph showing volumetric swelling ratios of pDAx1, 2, and 3 with the two ILs. For each IL, the swelling ratio decreases with progressively higher degree of cross-linking.
FIG. 1C shows FTIR spectra of the ion-gels. The peak intensities attributed to the ILs decrease with increasing crosslinking densities.
FIG. 1D is a graph showing elastic moduli of the dry iCVD pDAx films and the ion-gels. The values for iCVD-derived ion-gels are ~3 orders of magnitude higher than previously reported.

In certain embodiments, the invention relates to materials and methods for fabricating low-voltage MHz IGT devices using patternable defect-free ion-gels. In certain embodiments, the ion-gels exhibit about 1 μF cm$^{-2}$ at about 1 MHz. In certain embodiments, the thickness of ion-gels is as low as about 20 nm.

In certain embodiments, the invention relates to a method of fabricating the ion-gels described herein using a polymer chemical vapor deposition (CVD) technique, initiated CVD (iCVD). Different from many vapor-based deposition techniques, iCVD has the advantageous characteristics of low process temperature, making it compatible with flexible substrates such as plastics. Its solvent-free nature is an additional advantage in the methods described herein, eliminating the possibility of contaminating the active channel of a transistor. In certain embodiments, the methods described herein comprise the steps of: synthesizing a crosslinked polymer network via iCVD, and impregnating the crosslinked polymer network with an IL. In some embodiments, the crosslinked polymer network is synthesized and patterned in one step (i.e., simultaneously) using a shadow mask. In certain embodiments, the crosslinked polymer is impregnated with the IL using a contact swelling method.

In certain embodiments, the invention relates to ion-gels having desirable characteristics, such as high smoothness, high uniformity, low thickness, high capacitance at 1 MHz, and weak dependency on frequency. In certain embodiments, the ion-gels are substantially defect-free, such as substantially pinhole-free. In certain embodiments, the thickness of the ion-gels is about 20 nm to about 1 μm, for example, about 20 nm to about 400 nm, or about 20 nm to about 300 nm. In certain embodiments, the ion-gels display exceptionally high specific capacitance (for example, greater than about 1 μF cm$^{-2}$).

In certain embodiments, the invention relates to a thin film transistor (TFT) comprising a gate insulator comprising any of the ion-gels described herein. In certain embodiments, the TFT may be operated at low voltage, for example, less than about 2 V. In certain embodiments, the TFT is flexible.

Initiated Chemical Vapor Deposition

Materials-processing often involves the deposition of films or layers on a surface of a substrate. One manner of effecting the deposition of such films or layers is through chemical vapor deposition (CVD). CVD involves a chemical reaction of vapor phase chemicals or reactants that contain the constituents to be deposited on the substrate. Reactant gases are introduced into a reaction chamber or reactor, and are decomposed and reacted at a heated surface to form the desired film or layer.

One method of CVD is initiated CVD (iCVD). In an iCVD process, thin filament wires are heated, thus supplying the energy to fragment a thermally-labile initiator, thereby forming a radical at moderate temperatures. The use of an initiator not only allows the chemistry to be controlled, but also accelerates film growth and provides control of molecular weight and rate. The energy input is low due to the low filament temperatures, but high growth rates may be achieved. The process progresses independent from the shape or composition of the substrate, is easily scalable, and easily integrated with other processes.

In certain embodiments, iCVD takes place in a reactor. In certain embodiments, a variety of monomer species may be polymerized and deposited by iCVD; these monomer species are well-known in the art. In certain embodiments, the surface to be coated is placed on a stage in the reactor and gaseous precursor molecules are fed into the reactor; the stage may be the bottom of the reactor and not a separate entity. In certain embodiments, a variety of carrier gases are useful in iCVD; these carrier gases are well-known in the art.

In certain embodiments, the iCVD reactor has automated electronics to control reactor pressure and to control reactant flow rates. In certain embodiments, any unreacted vapors may be exhausted from the system.

In certain embodiments, the iCVD coating process can take place at a range of pressures from atmospheric pressure to low vacuum. In certain embodiments, the pressure is less than about 50 torr. In certain embodiments, the pressure is less than about 40 torr. In certain embodiments, the pressure is less than about 30 torr. In certain embodiments, the pressure is less than about 20 torr. In certain embodiments, the pressure is less than about 10 torr. In certain embodiments, the pressure is less than about 5 torr. In certain embodiments, the pressure is less than about 1 torr. In certain embodiments, the pressure is less than about 0.7 torr. In certain embodiments, the pressure is less than about 0.4 torr. In certain embodiments, the pressure is about 50 torr. In certain embodiments, the pressure is about 40 torr. In certain embodiments, the pressure is about 30 torr. In certain embodiments, the pressure is about 20 torr. In certain embodiments, the pressure is about 10 torr. In certain embodiments, the pressure is about 5 torr. In certain embodiments, the pressure is about 1 torr. In certain embodiments, the pressure is about 0.7 torr. In certain embodiments, the pressure is about 0.4 torr. In certain embodiments, the pressure is about 0.2 torr. In certain embodiments, the pressure is about 0.1 torr. In certain embodiments the pressure is about 1 torr; about 0.9 torr; about 0.8 torr; about 0.7 torr; about 0.6 torr; about 0.5 torr; about 0.4 torr; about 0.3 torr; about 0.2 torr; or about 0.1 torr. In certain embodiments, the pressure is greater than about 1 mtorr.

In certain embodiments, the flow rate of the monomer can be adjusted in the iCVD method. In certain embodiments, the monomer flow rate is about 100 sccm (standard cubic centimeters per minute). In certain embodiments, the monomer flow rate is about 90 sccm. In certain embodiments, the monomer flow rate is about 80 sccm. In certain embodiments the monomer flow rate is about 70 sccm. In certain embodiments, the monomer flow rate is about 60 sccm. In certain embodiments, the monomer flow rate is about 50 sccm. In certain embodiments, the monomer flow rate is about 40 sccm. In certain embodiments, the monomer flow rate is about 30 sccm. In certain embodiments, the monomer flow rate is about 20 sccm. In certain embodiments, the monomer flow rate is less than about 100 sccm. In certain embodiments, the monomer flow rate is less than about 90 sccm. In certain embodiments, the monomer flow rate is less than about 80 sccm. In certain embodiments, the monomer flow rate is less than about 70 sccm. In certain embodiments, the monomer flow rate is less than about 60 sccm. In certain embodiments, the monomer flow rate is less than about 50 sccm. In certain embodiments, the monomer flow rate is less than about 40 sccm. In certain embodiments, the monomer flow rate is less than about 30 sccm. In certain embodiments, the monomer flow rate is less than about 20 sccm. In certain embodiments, the monomer flow rate is about 15 sccm. In certain embodiments, the flow rate is less than about 15 sccm. In certain embodiments, the monomer flow rate is about 14 sccm. In certain embodiments, the flow rate is less than about 14 sccm. In certain embodiments, the monomer flow rate is about 13 sccm. In certain embodiments, the flow rate is less than about 13 sccm. In certain embodiments, the monomer flow rate is about 12 sccm. In certain embodiments, the flow rate is less than about 12 sccm. In certain embodiments, the monomer flow rate is about 11 sccm. In certain embodiments, the flow rate is less than about 11 sccm. In certain embodiments, the monomer flow rate is about 10 sccm. In certain embodiments, the flow rate is less than about 10 sccm. In certain embodiments, the monomer flow rate is about 9 sccm. In certain embodiments, the flow rate is less than about 9 sccm. In certain embodiments, the monomer flow rate is about 8 sccm. In certain embodiments, the flow rate is less than about 8 sccm. In certain embodiments, the monomer flow rate is about 7 sccm. In certain embodiments, the flow rate is less than about 7 sccm. In certain embodiments, the monomer flow rate is about 6 sccm. In certain embodiments, the flow rate is less than about 6 sccm. In certain embodiments, the monomer flow rate is about 5 sccm. In certain embodiments, the flow rate is less than about 5 sccm. In certain embodiments, the monomer flow rate is about 3 sccm. In certain embodiments, the flow rate is less than about 3 sccm. In certain embodiments, the monomer flow rate is about 1.5 sccm. In certain embodiments, the flow rate is less than about 1.5 sccm. In certain embodiments, the monomer flow rate is about 0.75 sccm. In certain embodiments, the flow rate is less than about 0.75 sccm. In certain embodiments, the monomer flow rate is about 0.6 sccm. In certain embodiments, the flow rate is less than about 0.6 sccm. In certain embodiments, the monomer flow rate is about 0.5 sccm. In certain embodiments, the flow rate is less than about 0.5 sccm. When more than one monomer is used (i.e., to deposit co-polymers), the flow rate of the additional monomers, in certain embodiments, may be the same as those presented above.

In certain embodiments, the temperature of the monomer can be adjusted in the iCVD method. In certain embodiments, the monomer can be heated and delivered to the chamber by a heated mass flow controller. In certain embodiments, the monomer can be heated and delivered to the chamber by a needle valve. In certain embodiments, the monomer is heated at about 30° C., about 35° C., about 40° C., about 45° C., about 50° C., about 55° C., about 60° C., about 65° C., about 70° C., about 75° C., about 80° C., about 85° C., about 90° C., about 95° C., or about 100° C.

In certain embodiments, the flow rate of the initiator can be adjusted in the iCVD method. In certain embodiments the initiator flow rate is about 100 sccm. In certain embodiments, the initiator flow rate is about 90 sccm. In certain embodiments, the initiator flow rate is about 80 sccm. In certain embodiments, the initiator flow rate is about 70 sccm. In certain embodiments, the initiator flow rate is about 60 sccm. In certain embodiments, the initiator flow rate is about 50 sccm. In certain embodiments, the initiator flow rate is about 40 sccm. In certain embodiments, the initiator flow rate is about 30 sccm. In certain embodiments, the initiator flow rate is about 20 sccm. In certain embodiments, the initiator flow rate is less than about 100 sccm. In certain embodiments, the initiator flow rate is less than about 90 sccm. In certain embodiments, the initiator flow rate is less than about 80 sccm. In certain embodiments, the initiator flow rate is less than about 70 sccm. In certain embodiments, the initiator flow rate is less than about 60 sccm. In certain embodiments, the initiator flow rate is less than about 50 sccm. In certain embodiments, the initiator flow rate is less than about 40 sccm. In certain embodiments, the initiator flow rate is less than about 30 sccm. In certain embodiments, the initiator flow rate is less than about 20 sccm. In certain embodiments, the initiator flow rate is about 10 sccm. In certain embodiments, the flow rate is less than about 10 sccm. In certain embodiments, the initiator flow rate is about 5 sccm. In certain embodiments, the flow rate is less than about 5 sccm. In certain embodiments, the initiator flow rate is about 3 sccm. In certain embodiments, the flow rate is less than about 3 sccm. In certain embodiments, the initiator flow rate is about 1.5 sccm. In certain embodiments, the flow rate is less than about 1.5 sccm. In certain embodiments, the initiator flow rate is about 0.75 sccm. In certain embodiments, the flow rate is less than about 0.75 sccm. In certain embodiments, the initiator flow rate is about 0.5 sccm. In certain embodiments, the flow rate is less than about 0.5 sccm. In certain embodiments, the initiator flow rate is about 0.4 sccm. In certain embodiments, the flow rate is less than about 0.4 sccm. In certain embodiments, the initiator flow rate is about 0.3 sccm. In certain embodiments, the flow rate is less than about 0.3 sccm. In certain embodiments, the initiator flow rate is about 0.2 sccm. In certain embodiments, the flow rate is less than about 0.2 sccm. In certain embodiments, the initiator flow rate is about 0.1 sccm. In certain embodiments, the flow rate is less than about 0.1 sccm. In certain embodiments, a variety of initiators are useful in iCVD; these initiators are well-known in the art.

In certain embodiments, the carrier gas is an inert gas. In certain embodiments, the carrier gas is nitrogen or argon.

In certain embodiments, the flow rate of the carrier gas can be adjusted in the iCVD method. In certain embodiments, the carrier gas flow rate is about 1000 sccm. In certain embodiments, the carrier gas flow rate is about 900 sccm. In certain embodiments, the carrier gas flow rate is about 800 sccm. In certain embodiments, the carrier gas flow rate is about 700 sccm. In certain embodiments, the carrier gas flow rate is about 600 sccm. In certain embodiments, the carrier gas flow rate is about 500 sccm. In certain embodiments, the carrier gas flow rate is about 400 sccm. In certain embodiments, the carrier gas flow rate is about 300 sccm. In certain embodiments, the carrier gas flow rate is about 200 sccm. In certain embodiments, the carrier gas flow rate is about 100 sccm. In certain embodiments, the carrier gas flow rate is about 90 sccm. In certain embodiments, the carrier gas flow rate is about 80 sccm. In certain embodiments, the carrier gas flow rate is about 70 sccm. In certain embodiments, the carrier gas flow rate is about 60 sccm. In certain embodiments, the carrier gas flow rate is about 50 sccm. In certain embodiments, the carrier gas flow rate is about 40 sccm. In certain embodiments, the carrier gas flow rate is about 30 sccm. In certain embodiments, the carrier gas flow rate is about 20 sccm. In certain embodiments, the carrier gas flow rate is less than about 1000 sccm. In certain embodiments, the carrier gas flow rate is less than about 900 sccm. In certain embodiments, the carrier gas flow rate is less than about 800 sccm. In certain embodiments, the carrier gas flow rate is less than about 700 sccm. In certain embodiments, the carrier gas flow rate is less than about 600 sccm. In certain embodiments, the carrier gas flow rate is less than about 500 sccm. In certain embodiments, the carrier gas flow rate is less than about 400 sccm. In certain embodiments, the carrier gas flow rate is less than about 300 sccm. In certain embodiments, the carrier gas flow rate is less than about 200 sccm. In certain embodiments, the carrier gas flow rate is less than about 100 sccm. In certain embodiments, the carrier gas flow rate is less than about 90 sccm. In certain embodiments, the carrier gas flow rate is less than about 80 sccm. In certain embodiments, the carrier gas flow rate is less than about 70 sccm. In certain embodiments, the carrier gas flow rate is less than about 60 sccm. In certain embodiments the carrier gas flow rate is less than about 50 sccm. In certain, embodiments the carrier gas flow rate is less than about 40 sccm. In certain embodiments, the carrier gas flow rate is less than about 30 sccm. In certain embodiments, the carrier gas flow rate is less than about 20 sccm. In certain embodiments, the carrier gas flow rate is about 10 sccm. In certain embodiments, the flow rate is less than about 10 sccm. In certain embodiments, the carrier gas flow rate is about 5 sccm. In certain embodiments, the flow rate is less than about 5 sccm. In certain embodiments, the flow rate is greater than about 4 sccm.

In certain embodiments, the temperature of the filament can be adjusted in the iCVD method. In certain embodiments the temperature of the filament is about 350° C. In certain embodiments the temperature of the filament is about 300° C. In certain embodiments the temperature of the filament is about 250° C. In certain embodiments the temperature of the filament is about 245° C. In certain embodiments the temperature of the filament is about 235° C. In certain embodiments the temperature of the filament is about 225° C. In certain embodiments the temperature of the filament is about 200° C. In certain embodiments the temperature of the filament is about 150° C. In certain embodiments the temperature of the filament is about 100° C.

In certain embodiments, the filament is about 0.1 cm to about 20 cm from the substrate stage. In certain embodiments, the filament is about 0.1 cm, about 0.2 cm, about 0.3 cm, about 0.4 cm, about 0.5 cm, about 0.6 cm, about 0.7 cm, about 0.8 cm, about 0.9 cm, about 1.0 cm, about 1.1 cm, about 1.2 cm, about 1.3 cm, about 1.4 cm, about 1.5 cm, about 1.6 cm, about 1.7 cm, about 1.8 cm, about 1.9 cm, about 2.0 cm, about 2.1 cm, about 2.2 cm, about 2.3 cm, about 2.4 cm, about 2.5 cm, about 3.0 cm, about 3.5 cm, about 4.0 cm, about 4.5 cm, about 5.0 cm, about 5.5 cm, about 6.0 cm, about 6.5 cm, about 7.0 cm, about 7.5 cm, about 8.0 cm, about 8.5 cm, about 9.0 cm, about 9.5 cm, about 10 cm, about 11 cm, about 12 cm, about 13 cm, about 14 cm, about 15 cm, about 16 cm, about 17 cm, about 18 cm, about 19 cm, or about 20 cm from the substrate stage. In certain embodiments, the filament is about 1.4 cm from the substrate stage.

In certain embodiments, the filament is oriented in any orientation with respect to the substrate stage or the chamber. In certain embodiments, the filament is oriented above the substrate stage, below the substrate stage, or beside the substrate stage.

In certain embodiments, the iCVD coating process can take place at a range of temperatures of the substrate stage. In certain embodiments, the temperature of the substrate stage is ambient temperature. In certain embodiments, the temperature of the substrate stage is about 25° C.; in yet other embodiments the temperature of the substrate stage is between about 25° C. and about 100° C., or between about 0° C. and about 25° C. In certain embodiments said temperature of the substrate stage is controlled by water.

In certain embodiments, the rate of polymer deposition is about 1 micron/minute. In certain embodiments, the rate of polymer deposition is between about 1 micron/minute and about 50 nm/minute. In certain embodiments, the rate of polymer deposition is between about 10 micron/minute and about 50 nm/minute. In certain embodiments, the rate of polymer deposition is between about 100 micron/minute and about 50 nm/minute. In certain embodiments, the rate of polymer deposition is between about 1 nm/minute and about 50 nm/minute. In certain embodiments, the rate of polymer deposition is between about 10 nm/minute and about 50 nm/minute. In certain embodiments, the rate of polymer deposition is between about 10 nm/minute and about 25 nm/minute.

Exemplary Compositions and Methods

In certain embodiments, the invention relates to a film comprising, consisting essentially of, or consisting of a crosslinked polymer and an ionic liquid, wherein the ionic liquid is dispersed in the crosslinked polymer; the crosslinked polymer comprises a plurality of residues of a monomer and a plurality of residues of a crosslinker; the film has a thickness of about 20 nm to about 1000 nm; and the film has a capacitance of about 1 $\mu F/cm^2$ to about 5 $\mu F/cm^2$ at a frequency of about 1 MHz.

In certain embodiments, the invention relates to any of the films described herein, wherein the thickness is about 20 nm to about 400 nm. In certain embodiments, the invention relates to any of the films described herein, wherein the thickness is about 20 nm to about 300 nm.

In certain embodiments, the invention relates to any of the films described herein, wherein the film has a capacitance of about 1 $\mu F/cm^2$ to about 3 $\mu F/cm^2$ at a frequency of about 1 MHz.

In certain embodiments, the invention relates to any of the films described herein, wherein the ionic liquid is hydrophobic.

In certain embodiments, the invention relates to any of the films described herein, wherein the ionic liquid is hydrophilic.

In certain embodiments, the invention relates to any of the films described herein, wherein the ionic liquid is selected from the group consisting of: 1-butyl-2,3-dimethylimidazolium tetrafluoroborate, 1-butyl-3-methylimidazolium bis(trifluoromethylsulfonyl)imide, 1-butyl-3-methylimidazolium hexafluorophosphate, 1-butyl-3-methylimidazolium tetrafluoroborate, 1-butyl-3-methylpyridinium bis(trifluoromethylsulfonyl)imide, 1-butyl-1-methylpyrrolidinium bis(trifluoromethylsulfonyl)imide, 1,2-dimethyl-3-propylimidazolium bis(trifluoromethylsulfonyl)imide, 1,2-dimethyl-3-propylimidazolium tris(trifluoromethylsulfonyl)methide, 1-dodecyl-3-methylimidazolium iodide, 1-ethyl-2,3-dimethylimidazolium trifluoromethanesulfonate, 1-ethyl-3-methylimidazolium bis(pentafluoroethylsulfonyl)imide, 1-ethyl-3-methylimidazolium bis(trifluoromethylsulfonyl)imide, 1-ethyl-3-methylimidazolium dicyanamide, 1-ethyl-3-methylimidazolium nitrate, 1-ethyl-3-methylimidazolium tetrachloroaluminate, 1-ethyl-3-methylimidazolium tetrafluoroborate, 1-ethyl-3-methylimidazolium thiocyanate, 1-ethyl-3-methylimidazolium trifluoromethanesulfonate, 3-methyl-1-propylpyridinium bis(trifluoromethylsulfonyl)imide, 1-methyl-3-octylimidazolium tetrafluoroborate, methyl-trioctylammonium bis(trifluoromethylsulfonyl)imide, tetrabutylammonium bis(trifluoromethylsulfonyl)imide, tetrabutylammonium bromide, tetrabutylphosphonium tetrafluoroborate, tetraethylammonium trifluoromethanesulfonate, and triethylsulfonium bis(trifluoromethylsulfonyl)imide. In certain embodiments, the invention relates to any of the films described herein, wherein the ionic liquid is 1-ethyl-3-methylimidazolium bis(trifluoromethylsulfonyl)imide or 1-ethyl-3-methylimidazolium dicyanamide. In certain embodiments, the invention relates to any of the films described herein, wherein the ionic liquid is 1-ethyl-3-methylimidazolium bis(trifluoromethylsulfonyl)imide. In certain embodiments, the invention relates to any of the films described herein, wherein the ionic liquid is 1-ethyl-3-methylimidazolium dicyanamide.

In certain embodiments, the invention relates to any of the films described herein, wherein each monomer is independently selected from the group consisting of: acrylamide, acrylic acid (AA), N-acryloyltris(hydroxymethyl)methylamine, 2-aminoethyl methacrylate, N-(3-aminopropyl)methacrylamide, butyl acrylate and methacrylate, diallylamine, diallylammonium chloride, N,N-diethylacrylamide, N,N-dimethylacrylamide, 2-(N,N-dimethylamino)ethyl acrylate and methacrylate, 2-(dimethylamino)ethyl acrylate and methacrylate, N[3-(N,N-dimethylamino)propyl]methacrylamide, ethoxyethyl methacrylate, ethyl acrylate, ethyl methacrylate, 2-(2-ethoxyethoxy)ethyl acrylate and methacrylate, 2,3-dihydroxypropyl acrylate and methacrylate, glyceryl monomethacrylate, glycidyl acrylate and methacrylate, 2-hydroxyethyl acrylate and methacrylate, N-(2-hydroxypropyl)methacrylamide, hydroxypropyl acrylate and methacrylate, methacrylamide, methacrylic acid (MAA), methacrylic anhydride, 2-(2-methoxy)ethyl acrylate and methacrylate, 2-methoxyethyl methacrylate, N-iso-propylacrylamide, poly(ethylene glycol) methyl ether methacrylate, 4-styrenesulfonic acid, 4-vinylpyridine, vinylsulfonic acid, and N-vinyl-2-pyrrodinone. In certain embodiments, the invention relates to any of the films described herein, wherein each monomer is N,N-dimethylacrylamide.

In certain embodiments, the invention relates to any of the films described herein, wherein each crosslinker is independently selected from the group consisting of: 2,2-bis[4-(2-acryloxyethoxy)phenyl]propane, 2,2-bis(4-methacryloxyphenyl)propane, butanediol diacrylate and dimethacrylate, 1,4-butanediol divinyl ether, 1,4-cyclohexanediol diacrylate and dimethacrylate, 1,4-diacryloylpiperazine, diallylphthalate, diethylene glycol diacrylate and dimethacrylate, 2,2-dimethylpropanediol diacrylate and dimethacrylate, dipentaerythritol pentaacrylate, dipropylene glycol diacrylate and dimethacrylate, divinylbenzene, glycerol trimethacrylate, N,N'-hexamethylenebisacrylamide, N,N'-octamethylenebisacrylamide, 1,5-pentanediol diacrylate and dimethacrylate, 1,3-phenylenediacrylate, poly(ethylene glycol)diacrylate and dimethacrylate, poly(propylene)diacrylate and dimethacrylate, triethylene glycol diacrylate and dimethacrylate, diethylene glycol divinyl ether, triethylene glycol divinyl ether, tripropylene glycol diacrylate or dimethacrylate, diallyl diglycol carbonate, poly(ethylene glycol) divinyl ether, N,N'-dimethacryloylpiperazine, divinyl glycol, ethylene glycol diacrylate, ethylene glycol dimethacrylate, N,N'-methylenebisacrylamide, tetra(ethylene glycol)diacrylate, 1,1,1-trimethylolethane trimethacrylate, 1,1,1-trimethylolpropane triacrylate, 1,1,1-trimethylolpropane trimethacrylate, 1,6-hexanediol diacrylate and dimethacrylate, 1,3-butylene glycol diacrylate and dimethacrylate, alkoxylated cyclohexane dimethanol dicarylate, alkoxylated hexanediol diacrylate, alkoxylated neopentyl glycol diacrylate, cyclohexane dimethanol diacrylate and dimethacrylate, ethoxylated bisphenol diacrylate and dimethacrylate, neopentyl glycol diacrylate and dimethacrylate, ethoxylated trimethylolpropane triarylate, propoxylated trimethylolpropane triacrylate, propoxylated glyceryl triacrylate, pentaerythritol triacrylate, tris (2-hydroxy ethyl)isocyanurate triacrylate, di-trimethylolpropane tetraacrylate, dipentaerythritol pentaacrylate, ethoxylated pentaerythritol tetraacrylate, pentaacrylate ester, and pentaerythritol tetraacrylate.

In certain embodiments, the invention relates to any of the films described herein, wherein each crosslinker is diethylene glycol divinyl ether.

In certain embodiments, the invention relates to any of the films described herein, wherein the crosslinked polymer is poly(N,N-dimethylacrylamide-co-diethylene glycol divinyl ether) (pDAx).

In certain embodiments, the invention relates to any of the films described herein, wherein the crosslinked polymer is polar.

In certain embodiments, the invention relates to any of the films described herein, wherein the monomer has a solubility parameter (δ) within 10% of the solubility parameter (δ) of the ionic liquid. In certain embodiments, the invention relates to any of the films described herein, wherein the crosslinked polymer has a solubility parameter (δ) within 10% of the solubility parameter (δ) of the ionic liquid.

In certain embodiments, the invention relates to any of the films described herein, wherein the monomer has a solubility parameter (δ) within 5% of the solubility parameter (δ) of the ionic liquid. In certain embodiments, the invention relates to any of the films described herein, wherein the crosslinked polymer has a solubility parameter (δ) within 5% of the solubility parameter (δ) of the ionic liquid.

In certain embodiments, the invention relates to any of the films described herein, wherein the crosslinked polymer has a solubility parameter (δ) of about 15 to about 25 $MPa^{1/2}$.

In certain embodiments, the invention relates to any of the films described herein, wherein the crosslinked polymer has a solubility parameter (δ) of about 21.1 $MPa^{1/2}$.

In certain embodiments, the invention relates to any of the films described herein, wherein the ionic liquid has a solubility parameter (δ) of about 15 to about 25 $MPa^{1/2}$.

In certain embodiments, the invention relates to any of the films described herein, wherein the ionic liquid has a solubility parameter (δ) of about 21.4 $MPa^{1/2}$.

In certain embodiments, the invention relates to any of the films described herein, wherein the film is disposed on a substrate. In certain embodiments, the invention relates to any of the films described herein, wherein the substrate is a Si wafer. In certain embodiments, the invention relates to any of the films described herein, wherein the film is disposed on the substrate in a pattern of a plurality of features. In certain embodiments, the invention relates to any of the films described herein, wherein each feature has a length or a width less than about 10 μm.

In certain embodiments, the invention relates to any of the films described herein, wherein the film has an elastic modulus of about 1 MPa to about 100 MPa. In certain embodiments, the invention relates to any of the films described herein, wherein the film has an elastic modulus of about 10 MPa to about 40 MPa. In certain embodiments, the invention relates to any of the films described herein, wherein the film has an elastic modulus of about 15 MPa to about 30 MPa.

In certain embodiments, the invention relates to any of the films described herein, wherein the surface of the film is substantially free from the ionic liquid in its liquid form.

In certain embodiments, the invention relates to any of the films described herein, wherein the monomer or the crosslinker comprises a nitrogen atom in its structure; and the presence of the nitrogen atom is detectable by $N_{1s}$ ARXPS of the film at a 30°, 55°, or 70° emission angle (with reference to surface normal).

In certain embodiments, the invention relates to any of the films described herein, wherein the ionic liquid comprises a nitrogen atom in its structure; and $N_{1s}$ ARXPS of the film at an emission angle of 55° (with reference to surface normal) results in a spectrum does not vary more than 20% as compared to a spectrum generated at an emission angle of 30°.

In certain embodiments, the invention relates to any of the films described herein, wherein the ionic liquid comprises a nitrogen atom in its structure; and $N_{1s}$ ARXPS of the film at an emission angle of 55° (with reference to surface normal) results in a spectrum does not vary more than 20% as compared to a spectrum generated at an emission angle of 70°.

In certain embodiments, the invention relates to any of the films described herein, wherein the film has a RMS roughness of about 0.1 nm to about 1.0 nm. In certain embodiments, the invention relates to any of the films described herein, wherein the film has a RMS roughness of about 0.35 nm to about 0.75 nm.

In certain embodiments, the invention relates to any of the films described herein, wherein the film has a RMS roughness of about 0.50 nm.

In certain embodiments, the invention relates to any of the films described herein, wherein the film is substantially pinhole-free.

In certain embodiments, the invention relates to any of the films described herein, wherein the film is substantially uniform across its thickness.

In certain embodiments, the invention relates to any of the films described herein, wherein the film is substantially homogeneous.

In certain embodiments, the invention relates to any of the films described herein, wherein the ratio of the capacitance of the film at 1 MHz to the capacitance of the film at 10 Hz is greater than about ⅓.

In certain embodiments, the invention relates to a method of making a film, comprising the steps of:

by iCVD, synthesizing and depositing on a substrate a crosslinked polymer, wherein the crosslinked polymer comprises a plurality of residues of a monomer and a plurality of residues of a crosslinker;

synthesizing a matrix comprising a bulk polymer and an ionic liquid; and contacting the crosslinked polymer with the matrix for a period of time sufficient to allow the ionic liquid to diffuse into the crosslinked polymer, thereby forming the film, wherein the film has a thickness of about 20 nm to about 1000 nm.

In certain embodiments, the invention relates to any of the methods described herein, further comprising the step of: before synthesizing and depositing the crosslinked polymer on the substrate, covering a portion of the surface of the substrate with a mask, thereby forming a covered portion and an exposed surface of the substrate.

In certain embodiments, the invention relates to any of the methods described herein, wherein the volume of the film is about 1.5 to about 3 times the volume of the crosslinked polymer.

In certain embodiments, the invention relates to any of the methods described herein, further comprising the step of: depositing an electrode on the film.

In certain embodiments, the invention relates to any of the methods described herein, wherein the method is a method of forming any of the films described herein.

In certain embodiments, the invention relates to a film formed by any of the methods described herein.

In certain embodiments, the invention relates to a device, comprising any of the films described herein, a cathode, and an anode.

Definitions

As used herein, the term "polymer" will be understood to mean a molecule of high relative molecular mass, the structure of which essentially comprises the multiple repetition of units (or "residues") derived, actually or conceptually, from molecules of low relative molecular mass.

Further, as used herein, the term "polymer" will be understood to mean a molecule that encompasses a backbone (also referred to as "main chain") of one or more distinct types of repeat units (the smallest constitutional unit of the molecule) and is inclusive of the commonly known terms "oligomer", "copolymer", "homopolymer", "random polymer" and the like. Further, it will be understood that the term polymer is inclusive of, in addition to the polymer itself, residues from initiators and other elements attendant to the synthesis of such a polymer, where such residues are understood as not being covalently incorporated thereto.

As used herein, the terms "residue," "repeat unit," "repeating unit," and "monomeric unit" are used interchangeably and will be understood to mean the constitutional repeating unit, which is the smallest constitutional unit the repetition of which constitutes a regular macromolecule, a regular oligomer molecule, a regular block or a regular chain.

As used herein, the term "hydrophobic" typically refers to a material having a contact angle of water in air of about 40° or more, and in some cases, about 60° or more. In contrast, the term "hydrophilic" typically refers to a material having a contact angle of water in air of less than about 40°. One suitable test for measuring the contact angle is ASTM D5725-99 (2008).

As used herein, the term "polar polymer" is a polymer that has a dielectric constant greater than about 3, for example, about 3 to about 9 at a frequency of about 60 Hz.

The term "solubility parameter" or "Hildebrand solubility parameter" (δ) is intended to provide a numerical estimate of the degree of interaction between materials, and can be a good indication of solubility. The Hildebrand solubility parameter is the square root of the cohesive energy density:

$$\delta = \sqrt{(\Delta H_v - RT)/V_m}$$

The cohesive energy density is the amount of energy needed to completely remove unit volume of molecules from their neighbors to infinite separation (an ideal gas). This is equal to the heat of vaporization of the compound divided by its molar volume in the condensed phase. In order for a material to dissolve, these same interactions need to be overcome as the molecules are separated from each other and surrounded by the solvent. Materials with similar solubility parameters will be able to interact with each other, resulting in solvation, miscibility or swelling.

Exemplification

The invention now being generally described, it will be more readily understood by reference to the following examples, which are included merely for purposes of illustration of certain aspects and embodiments of the invention, and are not intended to limit the invention.

Deposition of iCVD Polymer Matrix

All poly(N,N-dimethylacrylamide-co-diethylene glycol divinyl ether) (pDAx) films were deposited in a customer-built iCVD reactor. The monomer (N,N-dimethylacrylamide, DMAA, 99%, Aldrich), crosslinker (diethylene glycol divinyl ether, DEGDVE, 99%, Aldrich) and initiator (tent-butyl peroxide, TBPO, 98%, Aldrich) were used without further purification. They were flowed into the iCVD chamber through tubing. DMAA and DEGDVE were vaporized in glass jars heated at 67.5° C. and 50° C., respectively. Their vapor flow rates were controlled by a heated mass-flow controller (MKS instrument) and a needle valve, respectively. TBPO was maintained at room temperature and introduced controllably through a mass-flow controller (MKS instrument). The flow rates of precursors and the correspondingly synthesized polymers are listed in Table 0-1. Inside the reactor, TBPO was activated thermally to generate radicals by 14 parallel ChromAlloy hot filaments (Goodfellow) at 240° C. A back-cooled stage located approximately 3 cm beneath the filament array was maintained at 40° C. by circulation of coolant from an external chiller/heater (Neslab RTE-7). p-doped silicon wafers (resistivity 0.001-0.005 Ωcm, University Wafer) were used as substrate and secured on the stage during the deposition. A stencil mask was optionally used for patterning. The pressure in the reactor chamber was controlled at 400 mTorr using a throttle valve (MKS Instruments). Film growth was estimated and monitored in situ by an interferometer with a He—Ne laser (633 nm, IDS Uniphase) through a transparent quartz lid. A deposition was stopped once a desired thickness was reached.

TABLE 0-1

Flow rates of precursors for pDAx depositions

| Sample | Flow rate (sccm) | | |
|---|---|---|---|
| | DMAA | DEGDVE | TBPO |
| pDAx1 | 4.0 | 0.2 | 1.0 |
| pDAx2 | 4.0 | 0.4 | 1.0 |
| pDAx3 | 4.0 | 0.6 | 1.0 |

Fabrication of Ultrathin Ion-gels by Gel-mediated Contact Swelling (GMCS)

Bulk ion gels for impregnating pDAx were prepared by UV-initiated in situ free radical polymerization of vinyl monomers in ionic liquids. 1-ethyl-3-methylimidazolium bis(trifluoromethylsulfonyl)imide (emim TFSI, 98%, TCI America), 1-ethyl-3-methylimidazolium dicyanamide (emim DCA, 98%, Aldrich), poly(ethylene glycol) methyl ether methacrylate (PEGMEMA, $M_n$~300, Aldrich), ethylene glycol dimethacrylate (EGDMA, 98%, Aldrich), and 2,2-dimethoxy-2-phenylacetophenone (DMPA, 99%, Aldrich) were used without further purification. Monomer PEGMEMA, crosslinker EGDMA (3 vol % based on PEGMEMA), and photoinitiator DMPA (2 wt % based on PEGMEMA) were dissolved in ionic liquid emim TFSI or emim DCA (150 vol % based on PEGMEMA) under vigorous stirring until homogeneous. ~0.3 mL of the solution was spread between two glass slides separated by spacers (~1 mm). The mixture was irradiated by 365 nm UV light for 1 hr, generating fully solidified bulk gel. One of the glass slides was then carefully removed. The bulk gel was brought into intimate but gentle contact with the pDAx thin films. The contact was kept ~1 min to fully impregnate the iCVD films, after which the bulk gel was removed. As a result, clean ultrathin ion-gels whose surface is free of ionic liquids were obtained.

Materials Characterization

Thickness measurements of dry pDAx and ion-gels were performed using variable-angle spectroscopic ellipsometer (M-2000, J. A. Woollam) at 70° incidence angle. The ellipsometric data was fit to the Cauchy-Urbach model. Fourier transform infrared spectroscopy (FTIR) measurements of the films were performed on a Nicolet iS50 FT-IR Spectrometer (Thermo Scientific) equipped with a cadmium tellurium (MCT) detector in transmission mode. Spectra over 350-3500 $cm^{-1}$ with a resolution of 4 $cm^{-1}$ were collected and averaged over 256 scans to improve signal-to-noise ratio. All spectra were baseline-corrected. Cross-sectional images of the films were obtained by field emission scanning electron microscope (JEOL JSM-6700F). The surface morphology was characterized using atomic force microscopy (AFM) (Veeco, Nanoscope V with Dimension 3100) in tapping mode. The angle resolved X-ray photoelectron spectra (ARXPS) were acquired on a SSX-100X-probe (Surface Science Instruments) spectrometer. CasaXPS software was used to analyze the ARXPS data. All nanoindentation measurements were performed on ~2 μm thick films deposited on silicon wafers. The harder samples (dry films and pDAx2 and x3-based gels) were characterized by a triboindenter (Hysitron) with a 10 μm conical tip. Contact load was set to typically 0.1 to 0.3 μN for the gels and 0.5 μN for the dry films, while the maximum load was 100 μN. The measurements were repeated 16 times for each sample. The elastic moduli were analyzed using the Triboscan software. For the very soft gels (pDAx1-based), the triboindenter could not be used for indentation because of the undetectably low contact forces. Instead, the measurements were carried out on an Asylum MFP-3D instrument (Asylum Research), using an Asylum TR800PSA tip (pyramidal shape, tip radius ~20 nm, 24 kHz, 0.15 N/m). The elastic modulus was estimated from the Hertz model. The measurements were repeated 16 times. The 2D optical image of the patterned gels was obtained by a Zeta-20 color optical profiler (Zeta Instrument). The 3D topographic image of the patterned ion-gels was recorded using a laser scanning confocal microscopy (Keyence VK-X200). The ion-gels were first coated with an 8 nm thick refractive layer (Au/Pd) to reduce transparency and thus enhance the imaging process. A 50× object lens was used for all the images. For a typical image, 30 scans were sequentially carried out on a 5×6 grid, and stitched together to form the final image. The height image was analyzed by the VK analyzer software.

The MIM device was constructed with the modification of employing a liquid metal top electrode (gallium-indium eutectic, EGaIn, 99.99%, Aldrich). The apparatus for hanging EGaIn drop electrodes was similar to what is described elsewhere. Differently, to more precisely control the contact area between an EGaIn electrode and the sample, a microsyringe fixture (Rame-Hart, 100-10) was used to finely adjust the vertical position of the pendant metal drop. The EGaIn drops would attach to the gel films after measurements. An optical microscope (Olympus) was used to measure the contact areas (c.a. 0.5 mm$^2$). Electrochemical impedance spectroscopy (EIS) measurements were performed using a Solartron SI1287 over the frequency range of 2 MHz to 10 Hz with an AC amplitude of 10 mV at 0 DC voltage. Measurements were repeated 5-6 times for each sample. The data was analyzed using software Zview.

Mesh Size Calculation

To calculate the mesh size of pDAx2 film swollen by emim TFSI, the average molecular weight between crosslinks $M_c$ needs to be calculated first according to Flory-Rehner equation.

$$-[\ln(1-\phi_2) + \phi_2 + \chi_{12}\phi_2^2] = \frac{V_1}{v_2 M_c}\left(\phi_2^{1/3} - \frac{\phi_2}{2}\right) \quad (0.3)$$

where $\phi_2$ denotes the volume fraction of pDAx in the swollen mass (inverse of volumetric swelling ratio), $\chi_{12}$ is the Flory interaction parameter between pDAx and emim TFSI, $V_1$ is the molar volume of emim TFSI, and $v_2$ is the specific volume of the polymer.

In this case, however, the films were attached to a surface, and thus only swell in the direction normal to the surface. In this situation, Equation (1.3) should be modified to:

$$-[\ln(1-\phi_2) + \phi_2 + \chi_{12}\phi_2^2] = \frac{V_1}{v_2 M_c}\left(\phi_2^{-1} - \frac{\phi_2}{2}\right) \quad (0.4)$$

$\chi_{12}$ can be obtained using the solubility parameters of emim TFSI ($\delta_1$) and poly(DMAA) ($\delta_2$) according to:

$$\chi_{12} = [V_1(\delta_1-\delta_2)^2]/RT + 0.34 \quad (0.5)$$

where R is ideal gas constant, and T denotes absolute temperature. The values of $\delta_1$ and $\delta_2$ are reported to be 21.4 and 21.1 MPa$^{1/2}$, respectively. Using the $\chi_{12}$ obtained and the modified Flory-Rehner equation (1.4), $M_c$ was calculated to be 6348.4 g/mol. The mesh size $\xi$ can be therefrom calculated using equation:

$$\xi = (\phi_2)^{-1/3}l\left(\frac{2M_c}{M_m}\right)^{1/2} C_n^{1/2} \quad (0.6)$$

where l is the length of C—C bond (0.154 nm), $C_n$ is the characteristic ratio (8.5), and $M_m$ is the molecular weight of monomer DMAA. $\xi$ was finally estimated to be 6.5 nm.

Results and Discussion

The fabrication process of the ion-gels is schematically depicted in FIG. 1A. First, a crosslinked polymer network, poly(N,N-dimethylacrylamide-co-diethylene glycol divinyl ether) (pDAx), was deposited on substrates via iCVD under in situ thickness monitoring. A stencil mask was optionally used to easily pattern the deposition—polymer synthesis, thin film deposition, and patterning were achieved in a single step. After iCVD deposition, the polymer networks were to be infused with ILs to form ion-gels. Two ILs, 1-ethyl-3-methylimidazolium bis(trifluoromethylsulfonyl)imide (emim TFSI) and 1-ethyl-3-methylimidazolium dicyanamide (emim DCA), were selected to test the applicability of the approach, with emim TFSI representing the hydrophobic and emim DCA representing the hydrophilic. The poly(DMAA)-based polymer network is highly polar and has a solubility parameter ($\delta$) of 21.1 MPa$^{1/2}$, extremely close to that of the ILs of interest (e.g. $\delta$ of emim TFSI ~21.4 MPa$^{1/2}$), suggesting the polymers' good swellability by the ILs. Liquid-phase ILs were used directly as the impregnating agent via drop casting and spin coating. However, it was difficult to obtain homogeneous films with desired thinness using this method. The films formed were minimally hundreds of nanometers thick, and, even more detrimentally, retained a residual layer of free ILs on top of the ion-gels, preventing a successful subsequent deposition of electrode. These free ILs were not incorporated into the polymer network, but attached to the surfaces of the gels due to their affinities to the polymer networks. They did not spin off or evaporate because of their viscosity and non-volatility. Recognizing that the use of liquid-phase ILs was causing the undesired heterogeneity of the ion-gel surface, the polymer networks were impregnated using only solid-state materials. This impregnation strategy is referred to as gel-mediated contact swelling (GMCS). Briefly, a bulk gel was prepared by UV-initiated polymerization; it consisted of poly(poly (ethylene glycol) methyl ether methacrylate) and emim TFSI/emim DCA. By contacting the bulk gel, which acts as a solid-state reservoir of IL, with the a poly(DMAA)-based thin film, the IL was infused spontaneously into the film because of a concentration gradient as well as a thermodynamic driving force (evidenced from the similarity of solubility parameters between poly(DMAA) and the ILs). Given the thinness of the polymer network, this diffusion process throughout the thin films was instantaneous. As a result, a clean nanoscale homogeneous ion-gel suitable for subsequent electrode deposition was fabricated, as evidenced from the surface characterization results shown herein.

Three networks with different crosslinking densities were synthesized by controlling the monomer and crosslinker flow-rates: pDAx1, pDAx2 and pDAx3. The different crosslinking densities were speculated to result in different compositions and mechanical properties of the ion-gels when the polymers were allowed to swell to equilibrium. Ellipsometry was used to measure the thickness of the polymer networks (~15 nm when dry) before and after IL impregnation. Shown in FIG. 1B, with emim TFSI, the volumetric swelling ratio of the pDAx1 (least crosslinked) is ~2.47, pDAx2 (moderately crosslinked) ~2.10, pDAx3 (most crosslinked) ~1.82. With emim DCA, the volumetric swelling ratios are ~2.73, 2.08, and 1.72, respectively. Correspondingly, the Fourier transform infrared spectroscopy (FTIR) results confirm the chemical composition of the different ion-gels, as shown in FIG. 1C. All ion-gels display a band at 1639 $cm^{-1}$, a characteristic of the amide C=O stretching. For the emim TFSI-impregnated gels, the swollen pDAx1 exhibits an intense peak at 1194 $cm^{-1}$, resulted from asymmetric stretching of sulfonyl group, while the same peak is less prominent for the pDAx2 and pDAx3. Similarly, for emim DCA-based gels, the least crosslinked one shows strongest nitrile stretching (~2131 $cm^{-1}$), while the most crosslinked one displays weakest band at this wavelength. The differences in IL content are also reflected in the ion-gels' different mechanical properties, as shown by the nanoindentation tests (FIG. 1D). While the dry pDAx films exhibit similar elastic moduli, from 3.7-7.6 GPa, the swollen films display one order of magnitude of difference. After impregnation with emim TFSI, the pDAx1, pDAx2, and pDAx3-based ion-gels exhibit elastic moduli of ~3.1, 15.4, and 23.7 MPa, respectively. For the emim DCA-based ion-gels, elastic moduli of ~1.9, 10.0, and 26.3 MPa were observed, from the least to the most crosslinked. To compare, the thick physically crosslinked ion-gels previously employed for TFT have an elastic modulus in the range of 1-10 kPa. They were reported to have limited compatibility with subsequent deposition of metal electrodes from vapor phase and yield shorts, presumably because of the softness of the gel materials. The iCVD ion-gels described herein, on the other hand, have ~3 orders of magnitude higher elastic modulus because of the chemical crosslinking and lower IL content. The added modulus would be appreciated from the perspective of processability, especially taking into account that the gels are in the form of thin film.

Figures 2A, 2B, 2C, 2D, 2E, 2F, 2G:
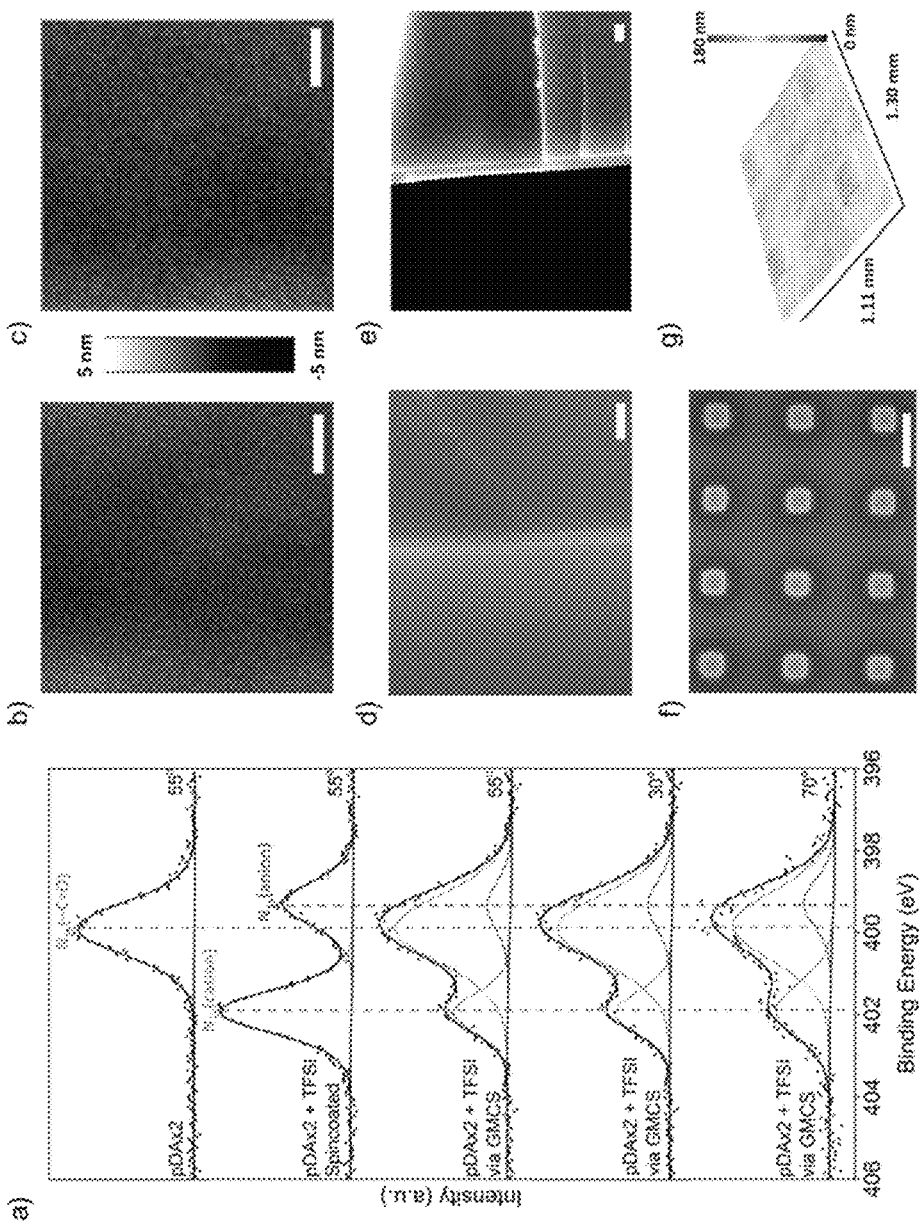
FIG. 2A shows $N_{1s}$ ARXPS high resolution scans at 55° emission angle (with reference to surface normal) of pDAx2 dry film, pDAx2 swollen directly with emim TFSI liquid followed by spinning off the excessive IL, and pDAx2 swollen by emim TFSI via GMCS. $N_{1s}$ scans of pDAx2 swollen via GMCS at 30 and 70° emission angles are also presented.
FIG. 2B is a AFM micrograph of a 47.5 nm pDAx2 film before swelling. Scale bar, 4 μm.
FIG. 2C is a AFM micrograph of a 47.5 nm pDAx2 film after swelling. Scale bar, 4 μm.
FIG. 2D is a cross-sectional image of a 47.5 nm pDAx2 film before swelling. Scale bar, 100 nm.
FIG. 2E is a cross-sectional image of a 47.5 nm pDAx2 film after swelling. Scale bar, 100 nm.
FIG. 2F is an optical microscopy image of a patterned ion-gel array of squares with 200 μm side length and 100 nm in thickness. Scale bar, 500 μm.
FIG. 2G is a 3D topographic image of the ion-gel array described in FIG. 2F.

Because of its electrochemical stability and ionic conductivity, an emim TFSI-based ion-gel was selected to further demonstrate its suitability as gate insulator. pDAx2 was used as the polymer network because it generates gels with a good combination of IL contents and elastic modulus. Unless otherwise noted, the ion-gels described hereafter in this "Results and Discussion" section are pDAx2 swollen by emim TFSI. First, angle-resolved X-ray photoelectron spectroscopy (ARXPS), focused on the high-resolution $N_{1s}$ scan, was conducted to confirm that the surface of the ion gels fabricated by the methods described herein is indeed free of liquid-phase IL and suitable for electrode deposition upon. As shown in FIG. 2A, i), a dry pDAx2 displays a single peak ~399.9 eV, attributed to $N_{1s}$ in the amide group. A pDAx2 film impregnated directly by liquid-phase emim TFSI via spincoating shows no presence of the amide $N_{1s}$, but two peaks at 401.9 eV and 399.3 eV due to the nitrogen atoms in the cations and anions of emim TFSI respectively (FIG. 2A, ii). This observation indicates that the gel prepared by this method is completely covered by free IL and will likely inhibit the formation of a stable metal electrode on it. On the contrary, the binding energy of $N_{1s}$ in pDAx2 impregnated via the GMCS methods described herein can be deconvoluted into all the three types of $N_{1s}$ using the relative peak positions of $N_{1s}$ (cation) and $N_{1s}$ (anion), and their area ratio (~1.9, close to the theoretical value 2). This observation is evidence that a real gel comprising IL immobilized in the polymer matrix has been formed at the surface. Moreover, the $N_{1s}$ scans at emission angle of 30°, 55°, and 70° (with reference to surface normal, corresponding to penetration depth of c.a. 3.9, 2.6, and 1.5 nm respectively) are essentially identical, demonstrating the homogeneity of the ion-gel near surface. The XPS results suggest that high-quality ultrathin films can be fabricated by the GMCS approaches described herein by involving only a neat solid-to-solid diffusion of IL.

Further, the surface morphology of the ion gel was examined by atomic force microscopy (AFM). For a dry pDAx2 with thickness of ~47.5 nm (Error! Reference source not found. FIG. 2B), the surface is extremely uniform and smooth (RMS roughness ~0.44 nm). As shown in FIG. 2C, after swelling via GMCS to ~100 nm with emim TFSI, the ion-gel formed displays virtually no morphological change (RMS roughness ~0.52 nm). Uniformity and smoothness are greatly desired characteristic of thin film insulator because a rough non-uniform surface often exhibits more pinholes and therefore leakage. The cross-section of the dry and swollen films (~47.5 and 100 nm, respectively) were examined with scanning electron microscopy (SEM), and their micrographs are shown in FIG. 2D and FIG. 2E, respectively. These images enable the direct observation of the ultrathin materials, and corroborate the uniformity and smoothness of the dry film and the gel.

Additionally, the patternability of the ion-gels is demonstrated. Incorporation of ion-gels into TFT requires patterning of these thin films. Previously, aerosol jet printing, transfer printing, and photopatterning have been utilized to create features with resolution on the order of 10 μm. Here, the patterning of iCVD ion-gels with a similar resolution can be achieved using a shadow mask, in the same step with the synthesis of the polymer networks, as schematically shown in FIG. 1A. Because a neat solid-state impregnation process is used, the IL only infuses into the pDAx patch, a strong and fast absorber of the IL, without contaminating other areas. An array of ion-gel squares (thickness ~100 nm, side length ~200 μm) deposited on a Si wafer were investigated. In the 2D optical images (FIG. 2F), clean boundaries and corners of the patterned ion-gels are observed. To gain more information, we utilized laser scanning confocal microscopy to obtain the 3D topographic image of the same patterned gels (FIG. 2G). The gel patches show relatively sharp protruded edges and uniform thickness. These results confirm that the iCVD ion gels are suitable for fabricating electrolyte-gated transistor with a similar footprint size.

Figures 3A, 3B, 3C, 3D:
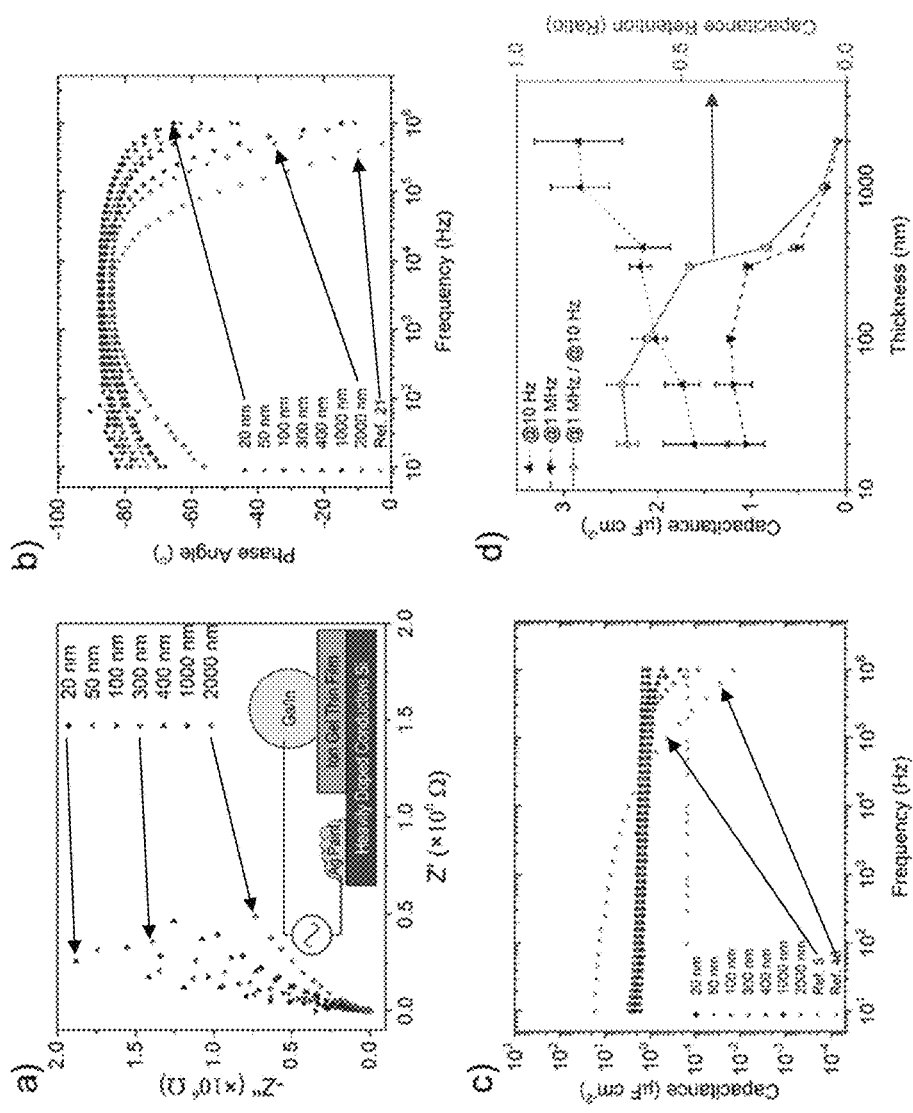
FIG. 3A is the median Nyquist plot for MIM capacitors with different ion-gel thicknesses.
FIG. 3B is the median plot of phase angle versus frequency plot for MIM capacitors with different ion-gel thicknesses. Data from Lee, K. H., et al. *J. Phys. Chem. B* 2011, 115, 3315-3321. ("Ref. 21") are included as comparison.
FIG. 3C is the median plot of Ci versus frequency for MIM capacitors with different ion-gel thicknesses. Data from Cho, J. H., et al. *Nat. Mater.* 2008, 7, 900-906 ("Ref 5") and Moon, H., et al. *Nat. Mater.* 2015, 14, 628-635 ("Ref. 46") are included for comparison.
FIG. 3D is a plot of Ci at 1 MHz, 10 Hz, and their ratio (i.e. capacitance retention at 1 MHz) versus ion-gel thickness.

After verifying that the ion-gel thin films meet all other requirements for gate insulator, their capacitance and ion transport properties were investigated. It is worth mentioning in advance that the mesh size in the ion-gel calculated from swelling ratio based on Flory-Rehner theory is ~6.5 nm (see above), significantly larger than the dimensions of the cation and the anion (0.99 and 1.15 nm respectively), suggesting an unhindered ion transport in the gel. The capacitance characteristics of the ion-gel with various thicknesses were evaluated in a metal-insulator-metal (MIM, FIG. 3A inset) configuration using electrochemical impedance spectroscopy (EIS). The MIM device was based on a well-established structure, with the modification of employing a liquid metal electrode. A 10 mV applied AC voltage from 1 MHz to 10 Hz, with no DC voltage, was used. FIG. 3A displays the Nyquist plots, imaginary part (Z″) vs real part (Z′) of the complex impedance, for films with thicknesses ranging from 20 to 2000 nm. The Nyquist plot for an ideal RC (resistor-capacitor) series circuit would be a straight vertical line. However, the deviation from ideal behavior for ion-gel insulator is typical due to "capacitance dispersion," resulting in a positive slope. Interestingly, the thinnest gels (20-100 nm) exhibit nearly vertical Nyquist plots, while the thick ones appear more deviated from vertical. So, thinning down ion-gels is beneficial when a more ideal-type dielectric is desired. In addition, the results suggest the absence of pinholes or leakage, even for the thinnest gel with 20 nm thickness.

The Bode phase plot is presented in FIG. 3B to give further insights. A phase angle of −90° indicates purely capacitive response, while a phase angle close to 0° suggests "lossy" resistive behavior. A value of −45° can be taken as the transition from capacitive to resistive characteristic. The thickest gel studied (~2000 nm) displays similar response to the ion-gel reported with a comparable thickness (~2200 nm), showing the transition around 100 kHz and near 0 phase angle at 1 MHz. However, reducing the thickness to between 20 and 400 nm, which has never been achieved before, the phase angle at 1 MHz exceeds −45°, indicative of predominantly capacitive response at this frequency. Notably, the 20 nm-gel shows a remarkable −65.3° at 1 MHz, suggestive of mostly capacitive behavior. The complex capacitance, C*, given by the ion-gels can be calculated from the impedance data according to equation:

$$C^* = \frac{1}{i2\pi f Z^*} \quad (0.7)$$

where f is the frequency, and Z* represents the complex impedance. The specific capacitance $C_i$ can be approximated as:

$$C_i = \frac{\text{Re}(C^*)}{A} \quad (0.8)$$

where Re(C*) represents the real part of C*, and A is the area of the electrode (circle with diameter of ~0.8 mm). The plot of $C_i$ vs frequency is given in FIG. 3C. Consistent with the phase angle results, the thickest gel studied shows a strong dependency on frequency, which is commonly observed for ion-gel dielectrics. As the gel becomes thinner, the dependency on frequency become increasingly weak. For the thinnest gels, $C_i$ approaches a horizontal straight line, a characteristic commonly observed for non-electrolyte gate insulators, which rely on dielectric polarization. The value of the specific capacitance of the thin ion-gels is, however, above 10 times higher than the non-electrolyte insulators. The lowest capacitance (at 1 MHz), the highest capacitance (at 10 Hz), and their ratio (i.e. the capacitance retention at 1 MHz) for each thickness were extracted and plotted in FIG. 3D. It appears that the low-frequency $C_i$ decreases slightly with the thickness reduced, while the high-frequency $C_i$ increases drastically by over one order of magnitude as the ion-gels thin down from 2000 nm to 20 nm. For gels with thickness between 20 and 300 nm, the $C_i$ maintains above 1 µF cm$^{-2}$ over the full frequency range from 10 Hz to 1 MHz, and the capacitance retention at 1 MHz is between 66% and 47%. Such constantly high capacitances have never been observed before. Displaying this electrical performance, these films hold great promise as gate insulator layers for low-voltage MHz TFTs.

In sum, the ion-gels described herein, with a suitable thickness under 300 nm, would be compatible with subsequent TFT fabrication steps such as metal deposition, given their ~3 orders of magnitude higher elastic moduli than the prevailing physical ion-gels.

INCORPORATION BY REFERENCE

All of the U.S. patents and U.S. published patent applications cited herein are hereby incorporated by reference.

EQUIVALENTS

Those skilled in the art will recognize, or be able to ascertain using no more than routine experimentation, many equivalents to the specific embodiments of the invention described herein. Such equivalents are intended to be encompassed by the following claims.

We claim:

1. A film comprising a crosslinked polymer and an ionic liquid, wherein the ionic liquid is dispersed in the crosslinked polymer; the crosslinked polymer comprises a plurality of residues of a monomer and a plurality of residues of a crosslinker; the film has a thickness of about 20 nm to about 1000 nm; and the film has a capacitance of about 1 µF/cm$^2$ to about 5 µF/cm$^2$ at a frequency of about 1 MHz.

2. The film of claim 1, wherein the ionic liquid is selected from the group consisting of: 1-butyl-2,3-dimethylimidazolium tetrafluoroborate, 1-butyl-3-methylimidazolium bis(trifluoromethylsulfonyl)imide, 1-butyl-3-methylimidazolium hexafluorophosphate, 1-butyl-3-methylimidazolium tetrafluoroborate, 1-butyl-3-methylpyridinium bis(trifluoromethylsulfonyl)imide, 1-butyl-1-methylpyrrolidinium bis(trifluoromethylsulfonyl)imide, 1,2-dimethyl-3-propylimidazolium bis(trifluoromethylsulfonyl)imide, 1,2-dimethyl-3-propylimidazolium tris(trifluoromethylsulfonyl)methide, 1-dodecyl-3-methylimidazolium iodide, 1-ethyl-2,3-dimethylimidazolium trifluoromethanesulfonate, 1-ethyl-3-methylimidazolium bis(pentafluoroethylsulfonyl)imide, 1-ethyl-3-methylimidazolium bis(trifluoromethylsulfonyl)imide, 1-ethyl-3-methylimidazolium dicyanamide, 1-ethyl-3-methylimidazolium nitrate, 1-ethyl-3-methylimidazolium tetrachloroaluminate, 1-ethyl-3-methylimidazolium tetrafluoroborate, 1-ethyl-3-methylimidazolium thiocyanate, 1-ethyl-3-methylimidazolium trifluoromethanesulfonate, 3-methyl-1-propylpyridinium bis(trifluoromethylsulfonyl)imide, 1-methyl-3-octylimidazolium tetrafluoroborate, methyl-trioctylammonium bis(trifluoromethylsulfonyl)imide, tetrabutylammonium bis(trifluoromethylsulfonyl)imide, tetrabutylammonium bromide, tetrabutylphosphonium tetrafluoroborate, tetraethylammonium trifluoromethanesulfonate, and triethylsulfonium bis(trifluoromethylsulfonyl)imide.

3. The film of claim 1, wherein the ionic liquid is 1-ethyl-3-methylimidazolium bis(trifluoromethylsulfonyl)imide or 1-ethyl-3-methylimidazolium dicyanamide.

4. The film of claim 1, wherein each monomer is independently selected from the group consisting of: acrylamide, acrylic acid (AA), N-acryloyltris(hydroxymethyl)methylamine, 2-aminoethyl methacrylate, N-(3-aminopropyl)methacrylamide, butyl acrylate and methacrylate, diallylamine, diallylammonium chloride, N,N-diethylacrylamide, N,N-dimethylacrylamide, 2-(N,N-dimethylamino)ethyl acrylate and methacrylate, 2-(dimethylamino)ethyl acrylate and methacrylate, N-[3-(N,N-dimethylamino)propyl]methacrylamide, ethoxyethyl methacrylate, ethyl acrylate, ethyl methacrylate, 2-(2-ethoxyethoxy)ethyl acrylate and methacrylate, 2,3-dihydroxypropyl acrylate and methacrylate, glyceryl monomethacrylate, glycidyl acrylate and methacrylate, 2-hydroxyethyl acrylate and methacrylate, N-(2-hydroxypropyl)methacrylamide, hydroxypropyl acrylate and methacrylate, methacrylamide, methacrylic acid (MAA), methacrylic anhydride, 2-(2-methoxy)ethyl acrylate and methacrylate, 2-methoxyethyl methacrylate, N-iso-propylacrylamide, poly(ethylene glycol) methyl ether methacrylate, 4-styrenesulfonic acid, 4-vinylpyridine, vinylsulfonic acid, and N-vinyl-2-pyrrodinone.

5. The film of claim 1, wherein each monomer is N,N-dimethylacrylamide.

6. The film of claim 1, wherein each crosslinker is independently selected from the group consisting of: 2,2-bis[4-(2-acryloxyethoxy)phenyl]propane, 2,2-bis(4-methacryloxyphenyl)propane, butanediol diacrylate and dimethacrylate, 1,4-butanediol divinyl ether, 1,4-cyclohexanediol diacrylate and dimethacrylate, 1,4-diacryloylpiperazine, diallylphthalate, diethylene glycol diacrylate and dimethacrylate, 2,2-dimethylpropanediol diacrylate and dimethacrylate, dipentaerythritol pentaacrylate, dipropylene glycol diacrylate and dimethacrylate, divinylbenzene, glycerol trimethacrylate, N,N'-hexamethylenebisacrylamide, N,N'-octamethylenebisacrylamide, 1,5-pentanediol diacrylate and dimethacrylate, 1,3-phenylenediacrylate, poly(ethylene glycol)diacrylate and dimethacrylate, poly(propylene)diacrylate and dimethacrylate, triethylene glycol diacrylate and dimethacrylate, diethylene glycol divinyl ether, triethylene glycol divinyl ether, tripropylene glycol diacrylate or dimethacrylate, diallyl diglycol carbonate, poly(ethylene glycol) divinyl ether, N,N'-dimethacryloylpiperazine, divinyl glycol, ethylene glycol diacrylate, ethylene glycol dimethacrylate, N,N'-methylenebisacrylamide, tetra(ethylene glycol) diacrylate, 1,1,1-trimethylolethane trimethacrylate, 1,1,1-trimethylolpropane triacrylate, 1,1,1-trimethylolpropane trimethacrylate, 1,6-hexanediol diacrylate and dimethacrylate, 1,3-butylene glycol diacrylate and dimethacrylate, alkoxylated cyclohexane dimethanol dicarylate, alkoxylated hexanediol diacrylate, alkoxylated neopentyl glycol diacrylate, cyclohexane dimethanol diacrylate and dimethacrylate, ethoxylated bisphenol diacrylate and dimethacrylate, neopentyl glycol diacrylate and dimethacrylate, ethoxylated trimethylolpropane triarylate, propoxylated trimethylolpropane triacrylate, propoxylated glyceryl triacrylate, pentaerythritol triacrylate, tris (2-hydroxy ethyl)isocyanurate triacrylate, di-trimethylolpropane tetraacrylate, dipentaerythritol pentaacrylate, ethoxylated pentaerythritol tetraacrylate, pentaacrylate ester, and pentaerythritol tetraacrylate.

7. The film of claim 1, wherein each crosslinker is diethylene glycol divinyl ether.

8. The film of claim 1, wherein the crosslinked polymer is poly(N,N-dimethylacrylamide-co-diethylene glycol divinyl ether) (pDAx).

9. The film of claim 1, wherein the monomer has a solubility parameter ($\delta$) within 10% of the solubility parameter ($\delta$) of the ionic liquid.

10. The film of claim 1, wherein the crosslinked polymer has a solubility parameter ($\delta$) of about 15 to about 25 $MPa^{1/2}$.

11. The film of claim 1, wherein the ionic liquid has a solubility parameter ($\delta$) of about 15 to about 25 $MPa^{1/2}$.

12. The film of claim 1, wherein the film is disposed on a substrate.

13. The film of claim 12, wherein the film is disposed on the substrate in a pattern of a plurality of features; and each feature has a length or a width less than about 10 µm.

14. The film of claim 1, wherein the film has an elastic modulus of about 1 MPa to about 100 MPa.

15. The film of claim 1, wherein the monomer or the crosslinker comprises a nitrogen atom in its structure; and the presence of the nitrogen atom is detectable by $N_{1s}$ ARXPS of the film at a 30°, 55°, or 70° emission angle (with reference to surface normal).

16. The film of claim 1, wherein the film has a RMS roughness of about 0.1 nm to about 1.0 nm.

17. The film of claim 1, wherein the ratio of the capacitance of the film at 1 MHz to the capacitance of the film at 10 Hz is greater than about 1/3.

18. A method of making a film, comprising the steps of:
by iCVD, synthesizing and depositing on a substrate a crosslinked polymer, wherein the crosslinked polymer comprises a plurality of residues of a monomer and a plurality of residues of a crosslinker;
synthesizing a matrix comprising a bulk polymer and an ionic liquid; and
contacting the crosslinked polymer with the matrix for a period of time sufficient to allow the ionic liquid to diffuse into the crosslinked polymer, thereby forming the film,
wherein the film has a thickness of about 20 nm to about 1000 nm.

19. The method of claim 18, further comprising the step of: before synthesizing and depositing the crosslinked polymer on the substrate, covering a portion of the surface of the substrate with a mask, thereby forming a covered portion and an exposed surface of the substrate.

20. A device, comprising a film of claim 1, a cathode, and an anode.

* * * * *